(12) United States Patent
Roth

(10) Patent No.: US 7,747,403 B2
(45) Date of Patent: Jun. 29, 2010

(54) METHOD FOR MEASURING THE PHASE JITTER OF A HIGH-FREQUENCY SIGNAL AND A MEASURING DEVICE FOR THE IMPLEMENTATION OF THIS METHOD

(75) Inventor: Alexander Roth, Dorfen (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 479 days.

(21) Appl. No.: 11/573,180

(22) PCT Filed: Jul. 11, 2005

(86) PCT No.: PCT/EP2005/007495

§ 371 (c)(1),
(2), (4) Date: Jul. 5, 2007

(87) PCT Pub. No.: WO2006/015677

PCT Pub. Date: Feb. 16, 2006

(65) Prior Publication Data

US 2008/0097710 A1    Apr. 24, 2008

(30) Foreign Application Priority Data

Aug. 3, 2004    (DE) .................... 10 2004 037 577

(51) Int. Cl.
*G01R 29/26*    (2006.01)
(52) U.S. Cl. ..................................... 702/69
(58) Field of Classification Search ............ 702/69, 702/72, 75–78, 81, 106, 107, 182, 189, 191; 324/76.11, 76.12, 76.23, 76.27, 76.28, 76.43, 324/76.44, 76.46
See application file for complete search history.

(56) References Cited

U.S. PATENT DOCUMENTS

| 5,337,014 | A | | 8/1994 | Najle et al. |
| 5,818,215 | A | * | 10/1998 | Miyamae et al. ......... 324/76.27 |
| 6,313,619 | B1 | | 11/2001 | Roth |
| 7,116,092 | B2 | * | 10/2006 | Jenkins et al. ............ 324/76.19 |
| 2003/0080724 | A1 | * | 5/2003 | Mar ........................ 324/76.52 |

FOREIGN PATENT DOCUMENTS

| EP | PCT/EP2005/007495 | 11/2005 |
| WO | PCT/EP2005/007495 | 5/2007 |

OTHER PUBLICATIONS

"Measuring Phase Noise with the Agilent 89400 Series Vector Signal Analyzers," Agilent Technologies, Project Note, Sep. 1, 2000, Agilent PN 894400-2, XP002352044.

Warren F. Walls, "Practical Problems Involving Phase Noise Measurements," $33^{rd}$ Annual Precise Time and Time Interval (PTTI) Meeting, 2001, pp. 407-416.

* cited by examiner

*Primary Examiner*—Mohamed Charioui
(74) *Attorney, Agent, or Firm*—Ditthavong Mori & Steiner, P.C.

(57) ABSTRACT

In order to measure the phase jitter of a high-frequency signal, a spectrum analyzer is used. The high-frequency signal (HF) to be measured is either multiplied by M and/or the output frequency of the variable frequency oscillator of the spectrum analyzer is divided by N, and both signals are set to the same frequency and mixed in a mixer. The output signal of the mixer is then evaluated in the preferably digital evaluating device of the spectrum analyzer according to the Fast Fourier Transformation principle. To this end, the spectrum analyzer requires only one additional mixer, frequency divider and/or frequency multiplier.

16 Claims, 1 Drawing Sheet

METHOD FOR MEASURING THE PHASE JITTER OF A HIGH-FREQUENCY SIGNAL AND A MEASURING DEVICE FOR THE IMPLEMENTATION OF THIS METHOD

FIELD OF THE INVENTION

The invention, according to various embodiments, relates to measuring the phase jitter of a high-frequency signal using a spectrum analyzer.

BACKGROUND OF THE INVENTION

Measuring the phase jitter of a high-frequency signal, for example, the output signal of an oscillator, has hitherto generally required a measuring station, which consists of several individual devices, which are relatively expensive and difficult to operate. These are generally a signal generator, a spectrum analyzer for low-frequency Fast-Fourier Transform (FFT), a control computer and a supplementary mixer. To measure the phase jitter, the high-frequency signal to be measured is mixed with a comparison signal of the same frequency generated in the signal generator. The mixer then supplies an output signal, which is the differential frequency between the high-frequency signal to be measured and the comparison signal. This therefore presents a measure for the phase jitter. This differential-frequency signal is evaluated after amplification in a low-noise amplifier using the FFT spectrum analyzer. By mixing both signals to 0 Hz, any AM modulation of the signal that may be present is suppressed, because the two in-phase side bands cancel each other out. In the case of a frequency modulation (FM) of the high-frequency signal to be measured, the side bands are out of phase, and their contribution is therefore added in the mixer.

A known measuring station of this kind for the measurement of phase jitter therefore distinguishes between AM and FM jitter and also allows the measurement of good oscillators. However, it requires a very good low-noise signal generator in the corresponding frequency range. An HF spectrum analyzer is often also required to determine the frequency of the measured signal together with an oscilloscope to check the synchronization. A known measuring station of this kind is therefore relatively complex, expensive and difficult to operate.

In principle, phase jitter can also be measured with a spectrum analyzer. However, the classic spectrum analyzer cannot distinguish between AM and FM modulation, although, generally, only the FM component needs to be measured. With modern spectrum analyzers with digital evaluation of the last intermediate frequency, the AM and FM modulation can in fact be measured separately, but the dynamic range of the analog/digital converter used is not sufficient for the measurement of good low-noise oscillators.

SUMMARY OF THE INVENTION

There exists a need for providing a simple method, according to which a phase-jitter measurement can be implemented using a conventional spectrum analyzer with a quality, which has hitherto only been possible with expensive measuring stations. A further aspect of an embodiment of the present invention is to provide a simple and cost-favorable measuring device for the implementation of a method of this kind.

In accordance with one embodiment of the present invention, a method according to the preamble of claim 1 by its characterising features. With regard to the measuring device, the features of claim 2 is provided. Advantageous further developments are indicated in the dependent claims, especially with regard to a measuring device of this kind for the implementation of a method in an exemplary embodiment of the present invention, which is simple to operate.

In accordance with one embodiment of the present invention, a conventional spectrum analyzer can be expanded with a simple, supplementary component group (mixer, frequency multiplier and/or frequency divider and switching unit) using the currently conventional digital evaluation to provide a high-quality phase-jitter analyzer, which combines in a single device without an additional signal generator all of the measuring functions of a phase-jitter measuring station and a spectrum analyzer; which allows a phase-jitter measurement even with good, low-noise oscillators; and which is extremely simple to operate. The measuring method in an exemplary embodiment of the present invention provides a high measurement dynamic with regard to basic jitter and achieves good values for phase jitter close to the carrier.

With the method in an exemplary embodiment of the present invention, the output frequency of the variable first oscillator of the spectrum analyzer, which is disposed above the input frequency range in spectrum-analyzer mode, is divided in the "phase-jitter-measurement" operating mode by a frequency divider, so that its phase jitter is improved by 20·log N (N=division factor of the frequency divider), thereby achieving the required quality.

Another possibility is to multiply the frequency of the high-frequency signal to be measured with regard to phase jitter through a frequency multiplier (multiplication factor M) and to mix this either with the undivided output frequency of the variable first oscillator or with a frequency-divided output frequency of the variable first oscillator; this also achieves the required quality of measurement. Frequency multiplication M and frequency division N are preferably selected and matched with one another in such a manner that their realization in circuit-technology is as simple as possible but still achieves the required quality of measurement. The frequency multiplier and frequency divider are adjustable particularly in their factors M and N respectively, most expediently to integer multiples.

In spite of this option of switching to a high-quality phase-jitter measurement, the functionality of the spectrum analyzer expanded for this purpose is fully preserved and can be used conventionally, for example, in order to analyze the frequency and level of an unknown input signal.

For a subsequent phase-jitter measurement all that is required is to connect together the component groups present in the spectrum analyzer in a manner similar to the manner conventional in the classic phase-jitter measuring station mentioned in the introduction. In principle, any spectrum analyzer, even those with analog FFT evaluation, can be expanded in an exemplary embodiment of the present invention into a phase-jitter analyzer. However, modern spectrum analyzers with digital evaluation in the last intermediate frequency are particularly suitable for this purpose.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawings and description are to be regarded as illustrative in nature, and not as restrictive.

The present invention is explained in greater detail below on the basis of one exemplary embodiment with reference to a schematic drawing. The drawing is as follows:

DETAILED DESCRIPTION OF THE PREFERRED EMBODIMENTS

Figure 1:
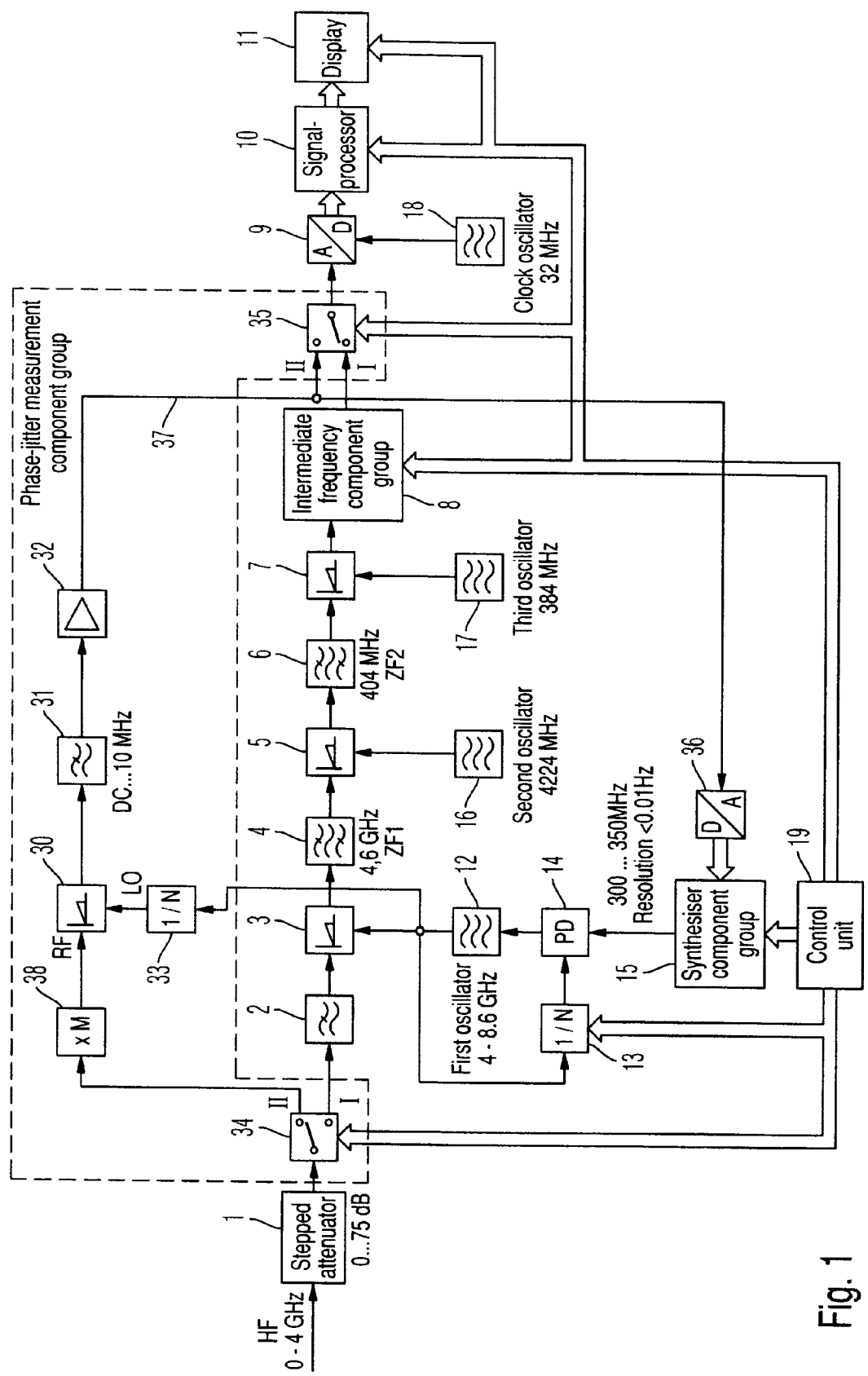
FIG. 1 shows the block circuit diagram of a spectrum analyzer, which can be used in an exemplary embodiment of the present invention.

The individual component groups of the spectrum analyzer are indicated in FIG. 1 with the reference numbers 1 to 19. The additional component groups, by means of which this spectrum analyzer is expanded to provide a measuring device for measuring phase jitter, are indicated with reference numbers greater than 30.

When operating the measuring device as a spectrum analyzer, the high-frequency input signal HF is supplied via a variable attenuator 1 and the input switching unit 34 occupying the switching position I to the input low-pass filter 2 and from there to the input mixer 3. The input low-pass filter 2 ensures an unambiguous imaging of the input signal, because the first intermediate frequency ZF1 is disposed above the input frequency range. The first frequency conversion in the input mixer 3 is implemented with the output frequency of a phase-controlled oscillator 12, of which the output frequency, divided in a controlled frequency divider 13, is synchronised in a phase comparator 14 with the output frequency of a frequency synthesiser 15. The synthesiser 15 is controlled via the control unit 19 in such a manner that it generates a continuously-changing output frequency.

The first intermediate frequency ZF1 is filtered in a band-pass filter 4, so that no image reception occurs even in the case of the frequency conversion to the second intermediate frequency ZF2 in the second mixer 5 by means of the fixed superposed frequency of an oscillator 16. The same applies for the band-pass filter 6 in combination with the subsequent mixer 7 and frequency conversion by means of a fixed oscillator 17. Three frequency conversions of this kind are conventionally selected in order to simplify the realization of the band-pass filter to the first intermediate frequency.

The resulting intermediate frequency ZF3 is further processed in an analog ZF filter component group 8. On the one hand, the signals are amplified to a level range favorable for the subsequent analog/digital converter 9; on the other hand, the signals are also pre-filtered with a bandwidth that is somewhat larger than the digitally-realised resolution bandwidth in the subsequent digital signal processing, in order to avoid over-driving the analog/digital converter 9. The supply of the output signal from the component group 8 to the analog/digital converter 9, which, for its part, is controlled via a clock-pulse generator 18, is implemented in switching position I of the output-end switching unit 35.

The digital signal processing in the last intermediate frequency, which is disposed, for example, at 20 MHz, allows the realization of any required filters, including filters that are not possible in analog technology as a result of the limited quality and maximum number of resonance circuits. In particular, this type of digital ZF processing also offers the possibility for analysis using the Fast-Fourier Transform of a baseband signal which is disposed in the frequency range from 0 to half of the analog/digital converter clock pulse.

During operation as a spectrum analyzer, the signal amplitude is accordingly displayed on the screen 11 via the frequency by automatically running through the relevant input frequency range.

The individual component groups for generating the variable-frequency oscillator frequency for the first frequency conversion and also for the digital signal processing are controlled in a known manner via a central control unit 19, through which the two switching units 34 and 35 are also controlled.

When operating the measuring device to measure the phase jitter of an input signal HF, for example, the output frequency of an oscillator, the two switching units 34 and 35 are switched into the switching position II under the control of the control unit 19. After passing through the attenuator 1, the input signal HF is accordingly supplied to the input of a supplementary mixer 30, to which the output frequency of the first frequency-variable oscillator 12 to 15, divided by the division factor N of a frequency divider 33, is supplied as a superposed frequency L0. As a result of the frequency division in the divider 33, the phase jitter of the first superposed oscillator is improved in such a manner that it is as good as a conventional signal generator as used hitherto in the measuring stations mentioned in the introduction.

Another possibility is to multiply the input signal HF through a frequency multiplier 38 by the factor M and to mix it in the mixer 30 either with the undivided output frequency of the first oscillator 12 or with the output frequency of this first oscillator divided in frequency by the factor N. With a frequency multiplier of this kind, a better measurement dynamic with regard to phase jitter is achieved in practice with a greater carrier spacing (greater than 1 MHz), because, by comparison with a frequency divider, a lower-noise frequency-multiplier of this kind can be realised. In control and evaluation, there is no great difference between a phase-jitter measurement on the ground wave or on a harmonic. During the evaluation in the processor, the measured results need only be corrected by the multiplication factor 20×Log M. Dependent upon the frequency range, the method in an exemplary embodiment of the present invention is used either only with a frequency multiplier or only with a frequency divider or with both possibilities at the same time. Both the frequency divider 33 and also the frequency multiplier 38 are preferably adjustable to integer factors.

For a phase-jitter measurement, the frequency of the high-frequency signal HF to be measured must either be known, or if not, it can be measured, for example, before the start of the measurement using the same measuring device operating in spectrum-analyzer mode (switching position I). At the start of the measurement, the multiplication factor M of the frequency multiplier 38 and/or the division factor N of the frequency divider 33 is adjusted, dependent upon the magnitude of the high-frequency signal HF to be measured, in such a manner that, with the output frequency variable at the first oscillator, an identical frequency of the two superposed frequencies supplied to the mixer 30 is achieved. At the start of the phase-jitter measurement, a rough agreement of the frequencies is sufficient. For example, if both a frequency multiplier 38 and also a frequency divider 33 is present—which is not absolutely necessary, since it is entirely sufficient in many cases to provide either only a frequency multiplier or only a frequency divider—and, for example, the phase jitter of an oscillator with the output frequency HF of 100 Hz is to be measured, then, for example, the frequency multiplier is set to a multiplication factor M=8, and the frequency divider 33 is set to a division factor N=10; the first oscillator 12 can then be set to 8 GHz, so that the two frequencies RF and LO supplied to the mixer 30 are each 800 MHz.

After a rough adjustment of the frequency of the first oscillator, the output frequency of the first oscillator is then controlled via a control circuit 37 in such a manner that the output frequency of the mixer 30 is 0 Hz. The control circuit 37 controls the synthesiser 15 via an analog/digital converter 36 in such a manner that the output voltage of the mixer 30 is held at an output level of 0 V. The output signal of the mixer 30 mixed down to 0 Hz passes through a low-pass filter 31 and is amplified in an extremely low-noise amplifier 32.

The control bandwidth can be adjusted to the synthesiser frequency via the controllable influence of the analog/digital converter 36. Since this control circuit 37 avoids large voltages at the output of the mixer 30, with an adequate amplification through the amplifier 32, the intrinsic jitter of the analog/digital converter 9 plays no role in the measurement dynamic attainable in the subsequent FFT evaluation.

The output signal of the amplifier 32 is supplied via the switching position II of the output switching unit 35 to the analog/digital converter 9 and is evaluated with regard to phase jitter in the signal processor 10 according to the Fast Fourier Transform principle. The result is displayed on the screen 11. Since the input signal is mixed down to 0 Hz in this phase-jitter measurement, any possible amplitude modulation is also suppressed, so that, as with a conventional measuring station, for example, only the FM jitter of an oscillator can be measured. The FFT evaluation is implemented in a known manner as with a conventional measuring station.

The present invention is not limited to the exemplary embodiment presented. All the features described above can be combined with one another as required.

What is claimed is:

1. A measuring device, comprising:
    a plurality of intermediate-frequency superposition stages,
    a variable-frequency first oscillator for a first one of the superposition stages,
    a first mixer of the first superposition stage,
    an analog/digital converter,
    a signal processor for evaluating an input signal according to a Fast Fourier Transform principle,
    a supplementary mixer, and at least one of:
    a frequency divider disposed between a first input of the supplementary mixer and the variable-frequency first oscillator, and
    a frequency multiplier disposed between the input of the measuring device and a second input of the supplementary mixer,
        wherein, in a spectrum analyzing operating mode for analyzing a frequency spectrum of the input signal, the input signal is converted by the variable-frequency first oscillator, the first mixer and each of the superposition stages subsequent to the first superposition stage into a plurality of intermediate frequencies, digitized in the analog/digital converter and evaluated in the signal processor according to the Fast Fourier Transform principle; and
        in a phase jitter measuring operating mode for measuring a phase jitter of the input signal, the input signal is selectively multiplied in the frequency multiplier, and then mixed down to a frequency zero in the supplementary mixer with an output of the variable-frequency first oscillator that is selectively divided in the frequency divider, the variable-frequency first oscillator is controlled via a control circuit in such a manner that frequencies of signals supplied via the first and second inputs to the supplementary mixer are identical, and an output of the supplementary mixer is then supplied directly to the input of the analog/digital converter and evaluated in the signal processor according to the Fast Fourier transform principle thereby measuring the phase-jitter of the input signal.

2. A measuring device according to claim 1, wherein at least one of a division ratio of the frequency divider and a multiplication factor of the frequency multiplier are adjustable.

3. A measuring device according to claim 2, wherein at least one of the division ratio of the frequency divider and the multiplication factor of the frequency multiplier are adjustable to integer factors.

4. A measuring device according to claim 2, wherein the division ratio of the frequency divider are different from the multiplication factor of the frequency multiplier.

5. A measuring device according to claim 1, wherein a pair of switching units are disposed respectively before the first superposition stage and before the analog/digital converter,
    when the switching units being set in a first switching position (I) during the spectrum analyzing operating mode, the input signal of the first superposition stage and the intermediate frequency signal are supplied to the analog/digital converter; and
    when the switching units being set in a second switching position (II) during the phase jitter measuring operating mode, the input signal is supplied to the supplementary mixer, and the output of the supplementary mixer is supplied to the analog/digital converter.

6. A measuring device according to claim 5, wherein
    a first superposed frequency is generated via a phase-controlled oscillator of the variable-frequency first oscillator, after being synchronized via a variable-frequency synthesizer of the variable-frequency first oscillator, and
    wherein, in the phase jitter measuring operating mode, the output of the supplementary mixer is digitized in a second analog/digital converter, to control the synthesizer in such a manner that the variable-frequency first oscillator generates the first superposed frequency that incurs a differential frequency of 0 Hz at the output of the supplementary mixer.

7. A measuring device according to claim 1,
    wherein a first superposed frequency is generated via a phase-controlled oscillator of the variable-frequency first oscillator, after being synchronized via a variable-frequency synthesizer of the variable-frequency first oscillator, and
    wherein, in the phase jitter measuring operating mode, the output of the supplementary mixer is digitized in a second analog/digital converter, to control the synthesizer in such a manner that the variable-frequency first oscillator generates the first superposed frequency, that incurs a differential frequency of 0 Hz at the output of the supplementary mixer.

8. A measuring device according to claim 7, wherein the variable-frequency synthesizer has a resolution bandwidth less than 0.01 Hz.

9. A measuring device according to claim 1, wherein the output of the supplementary mixer is amplified by means of a low-noise amplifier, before being supplied to the analog/digital converter.

10. A measuring device according to claim 1, wherein, in the spectrum analyzing operating mode, the output of the supplementary mixer is converted by the first superposition stage and two other intermediate-frequency superposition stages each of which has a fixed superposed frequency, and then digitized in the analog/digital converter.

11. A measuring device according to claim 1, comprising the frequency divider,
wherein in the phase jitter measuring operating mode, the input signal is mixed down to the frequency zero in the supplementary mixer with the output of the variable-frequency first oscillator that is divided in the frequency divider.

12. A measuring device according to claim 1, comprising the frequency multiplier,
wherein in the phase jitter measuring operating mode, the input signal is multiplied in the frequency multiplier, and then mixed down to the frequency zero in the supplementary mixer with the output of the variable-frequency first oscillator.

13. A measuring device according to claim 1, comprising the frequency divider and the frequency multiplier,
wherein in the phase jitter measuring operating mode, the input signal is multiplied in the frequency multiplier, and then mixed down to the frequency zero in the supplementary mixer with the output of the variable-frequency first oscillator that is divided in the frequency divider.

14. A measuring device according to claim 1, wherein the input signal passes the first mixer but not the supplementary mixer in the spectrum analyzing operating mode, and
the input signal passes the supplementary mixer but not the first mixer in the phase jitter measuring operating mode.

15. A measuring device according to claim 1, wherein the each subsequent superposition stage includes a mixer and a fixed-frequency oscillator which provides a fixed frequency to be superposed onto one of the intermediate frequencies in the mixer in the stage.

16. A measuring device according to claim 1, wherein the phase-jitter is of 100 Hz or less.

* * * * *